(12) United States Patent
Ha et al.

(10) Patent No.: US 9,784,806 B2
(45) Date of Patent: Oct. 10, 2017

(54) FRACTAL RF COILS FOR MAGNETIC RESONANCE IMAGING

(71) Applicant: The Regents of The University of California, Oakland, CA (US)

(72) Inventors: Seunghoon Ha, Irvine, CA (US);
Werner W. Roeck, Irvine, CA (US);
Orhan Nalcioglu, Newport Coast, CA (US)

(73) Assignee: The Regents of the University of California, Oakland, CA (US)

( * ) Notice: Subject to any disclaimer, the term of this patent is extended or adjusted under 35 U.S.C. 154(b) by 555 days.

(21) Appl. No.: 14/459,661

(22) Filed: Aug. 14, 2014

(65) Prior Publication Data
US 2015/0048828 A1    Feb. 19, 2015

Related U.S. Application Data

(60) Provisional application No. 61/866,306, filed on Aug. 15, 2013.

(51) Int. Cl.
*G01R 33/341* (2006.01)
*G01R 33/3815* (2006.01)
*G01R 33/3415* (2006.01)

(52) U.S. Cl.
CPC ........ *G01R 33/341* (2013.01); *G01R 33/3415* (2013.01); *G01R 33/3815* (2013.01)

(58) Field of Classification Search
CPC .............. G01R 33/341; G01R 33/3415; G01R 33/3815
See application file for complete search history.

(56) References Cited

U.S. PATENT DOCUMENTS

2010/0142785 A1* 6/2010 Dahnke ................ G01R 33/286
382/131

FOREIGN PATENT DOCUMENTS

CN          102749598 A  * 10/2012

OTHER PUBLICATIONS

Machine translation of CN 102749598A obtained on Feb. 17, 2017.*

* cited by examiner

*Primary Examiner* — Gregory H Curran
(74) *Attorney, Agent, or Firm* — Knobbe, Martens, Olson & Bear, LLP

(57) ABSTRACT

Methods and devices which can use fractal radiofrequency coils to improve the use of magnetic resonant imaging over, for example, standard circular coils. The fractal coils can be Koch loops, and can reduce or eliminate mutual inductance between pairs of coils. Further, embodiments of the fractal radiofrequency coils can be used with higher T magnetic resonance imaging.

14 Claims, 16 Drawing Sheets

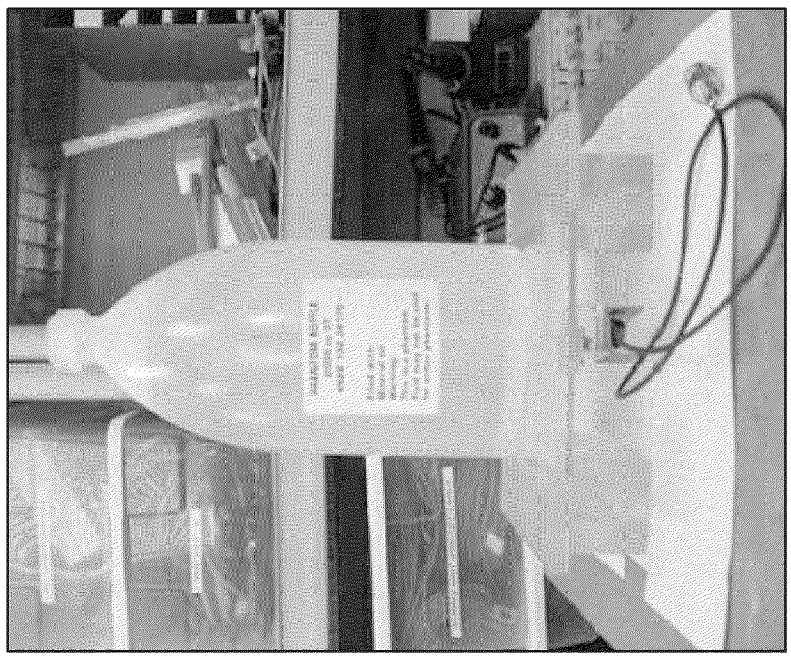
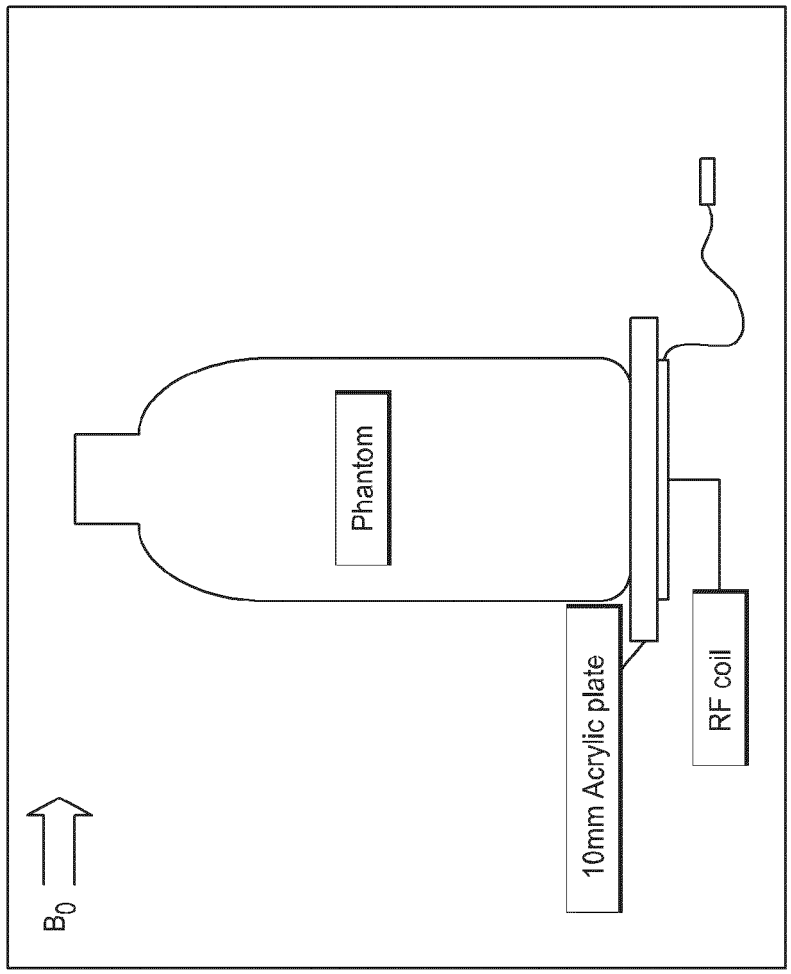
Figure 3A
Figure 3B

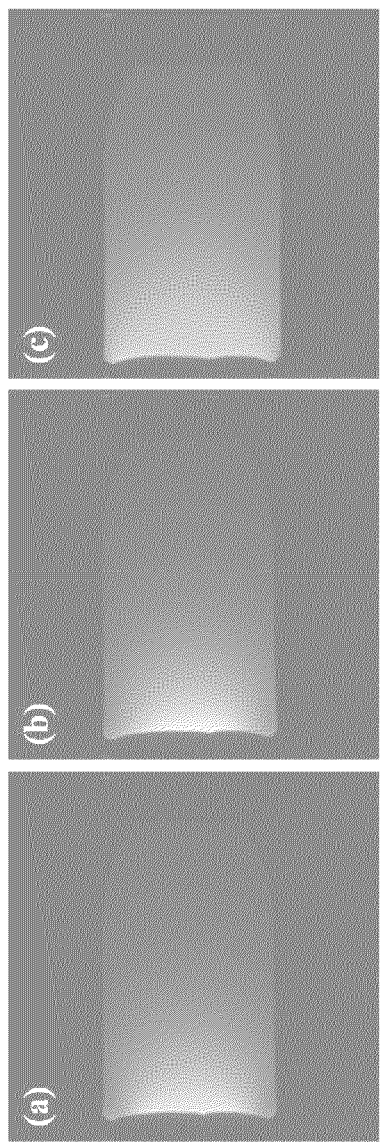
Figure 4A-C

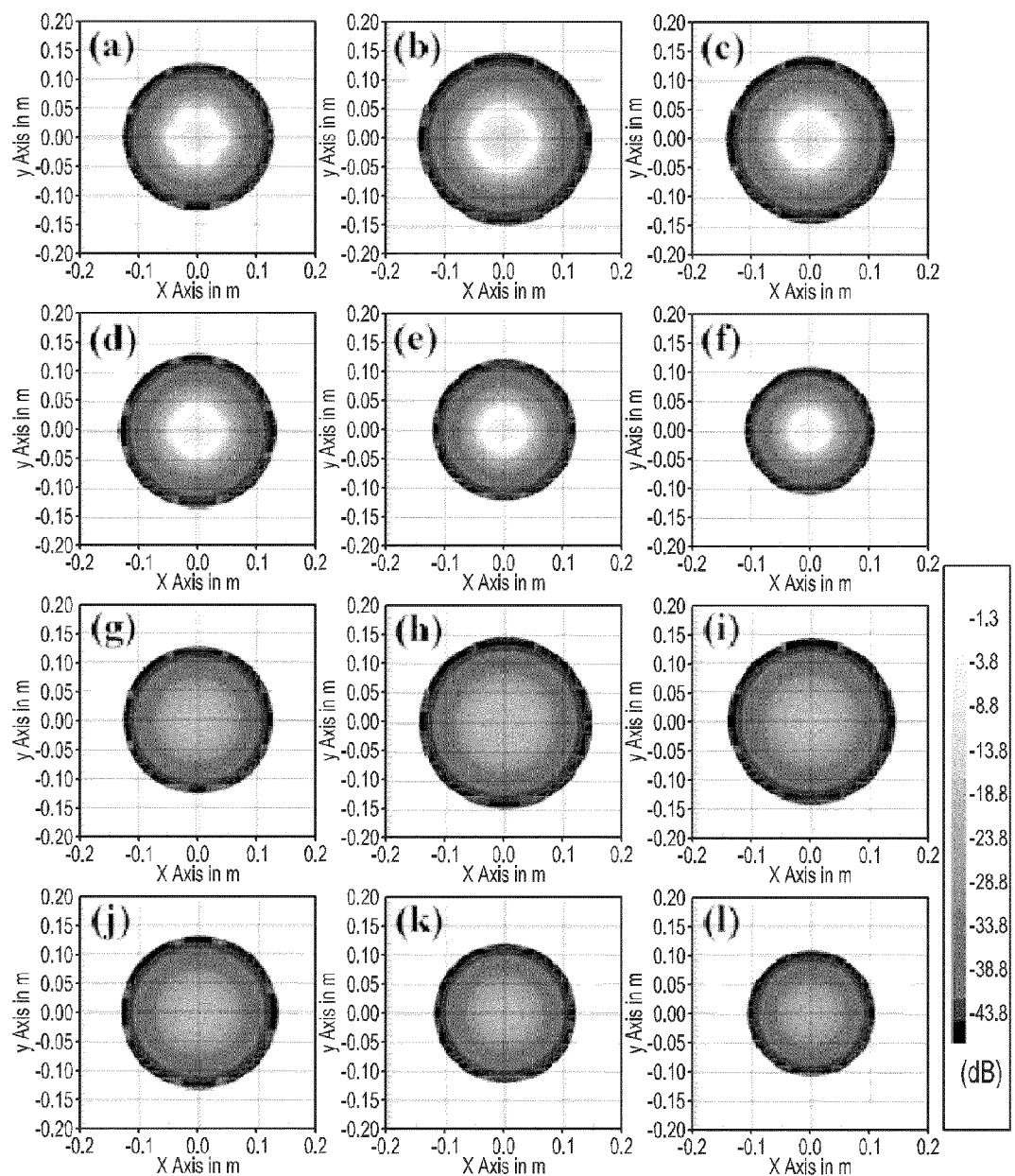
Figure 8A-L

Figure 11A-D

FRACTAL RF COILS FOR MAGNETIC RESONANCE IMAGING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is generally related to the use of fractal radiofrequency coils for magnetic resonance imaging.

Background

Conventional RF coils designed for magnetic resonance imaging (MRI) have various geometrical shapes such as a circular loop, saddle loop, or birdcage shape. In response to demands to obtain images with higher spatial resolution and signal-to-noise ratio, 3T MRI has become a clinical reality in order to answer complicated questions and to leverage the transfer of research methods into useful clinical applications. Current research at 7T MRI appears to have the potential for microscopic spatial resolution visualizing anatomy previously unseen and additionally may enable the observation and analysis of tissue metabolism and function is under ongoing development. A new concept for RF coil also has been designed to keep pace with higher resonance frequencies used at 3 or 7T. The patch antenna design for MRI proposed by Brunner et al (2009) is a representative example of such development (Brunner D O, De Zanche N, Frohlich J, Paska J, Pruessmann K P. Travelling-wave nuclear magnetic resonance. *Nature.* 2009; 457:994-998, hereby incorporated by reference in its entirety).

SUMMARY

Disclosed herein are embodiments of a magnetic resonance imaging device comprising at least one super-conducting magnet. At least one shim coil configured to compensate for magnetic field inhomogeneity, at least one gradient coil configured to provide a controlled field gradient in each direction, and at least one fractal shaped RF coil configured to detect an MR signal and to generate magnetic fields for exciting a sample.

In some embodiments, the device can further comprise a controller comprising programming and memory, the controller configured for inputting parameters to the magnetic resonance imaging device and for detecting and processing the MR signal. In some embodiments, the device can comprise at least two fractal shaped loop RF coils.

In some embodiments, the fractal shaped loop RF coil can have a narrower magnetic field along a horizontal plane parallel to the plane of the RF coil as compared to a circular shaped coil. In some embodiments, the fractal shaped loop RF coil can have higher magnetic field sensitivity in a plane vertical to the iso-center of the RF coil from the iso-center to 10 cm away than the circular shaped coil. In some embodiments, the at least two fractal shaped loop RF coils can have two overlap locations for decoupling mutual inductance. In some embodiments, the optimal overlap cations can have −31.9 dB and −37.5 dB. In some embodiments, a Q of the at least one fractal shaped RF coil can make no difference between deep overlapped RF coils array and swallow overlapped RF coils.

In some embodiments, the magnetic resonance imaging device can be operated at resonant frequencies equal to or greater than about 3T. In some embodiments, the magnetic resonance imaging device can be operated at resonant frequencies of equal to or less than about 7T.

In some embodiments, the at least one fractal shaped loop RF coil can comprise a Koch loop. In some embodiments, an air inductor is not used.

Also disclosed herein are embodiments of a method for imaging a patient comprising aligning magnetization of atomic nuclei in a sample, applying a radio frequency magnetic field from at least one fractal shaped RF coil configured to alter alignment of the magnetization, detecting a rotating magnetic field from the sample, and constructing an image from the rotating magnetic field.

In some embodiments, two fractal shaped RF coils can be used. In some embodiments, the two fractal shaped RF coils can be at least partially overlapped, and mutual inductance is generally eliminated.

In some embodiments, the magnetic field can be equal to or greater than about 3T. In some embodiments, the magnetic field can be equal to or less than about 7T.

Also disclosed herein are embodiments of a radiofrequency coil assembly for use in a magnetic resonance device comprising a first radiofrequency coil configured to receive a magnetic signal, the first radiofrequency coil having a Koch loop fractal shape and a second radiofrequency coil configured to receive a magnetic signal, the second radiofrequency coil having a Koch loop fractal shape, wherein the first and second fractal RF coils are at least partially overlapped, and wherein mutual inductance between the first and second fractal RF coils is generally eliminated.

In some embodiments, the first and second radiofrequency coils can be configured to operate at a magnetic resonance of at least about 3T or greater. In some embodiments, the first and second radiofrequency coils can be configured to operate at a magnetic resonance of about 7T or less.

Some embodiments of the disclosure describe a magnetic resonance imaging device which can comprise at least one super-conducting magnet, at least one shim coil configured to compensate for magnetic field inhomogeneity, at least one gradient coil configured to provide a controlled field gradient in each direction, and at least one fractal shaped RF coil configured to receive an MR signal and to generate magnetic fields for exciting a sample.

In some embodiments, the device can comprise at least two fractal shaped loop RF coils. In some embodiments, the fractal shaped loop RF coil can have a narrower magnetic field along a horizontal plane parallel to the plane of the RF coil as compared to a circular shaped coil. In some embodiments, the fractal shaped loop RF coil can have higher magnetic field sensitivity in a plane vertical to the iso-center of the RF coil from the iso-center to 10 cm away than the circular shaped coil. In some embodiments, the at least two fractal shaped loop RF coils can have two optimum overlap locations for decoupling mutual inductance. In some embodiments, the optimal overlap cations can have −31.9 dB and −37.5 dB. In some embodiments, a Q of the at least one fractal shaped RF coil can make no difference between deep overlapped RF coils array and swallow overlapped RF coils.

Embodiments of the disclosure also describe a method for imaging a patient which can comprise aligning magnetization of atomic nuclei in a sample, applying a radio frequency magnetic field from a fractal shaped RF coil configured to alter alignment of the magnetization, detecting a rotating magnetic field from the sample, and constructing an image from the rotating magnetic field.

BRIEF DESCRIPTION OF THE DRAWINGS

FIGS. 3A-B illustrate an experimental set up for testing RF coils, both circular and embodiments of a fractal coil.

FIGS. 4A-C illustrate sagittal images acquired from the experimental setup shown in FIG. 2 with three different RF coils.

FIGS. 8A-L illustrate H1 magnetic field generated by embodiments of RF coils that have various radii.

DETAILED DESCRIPTION

Figure 1:
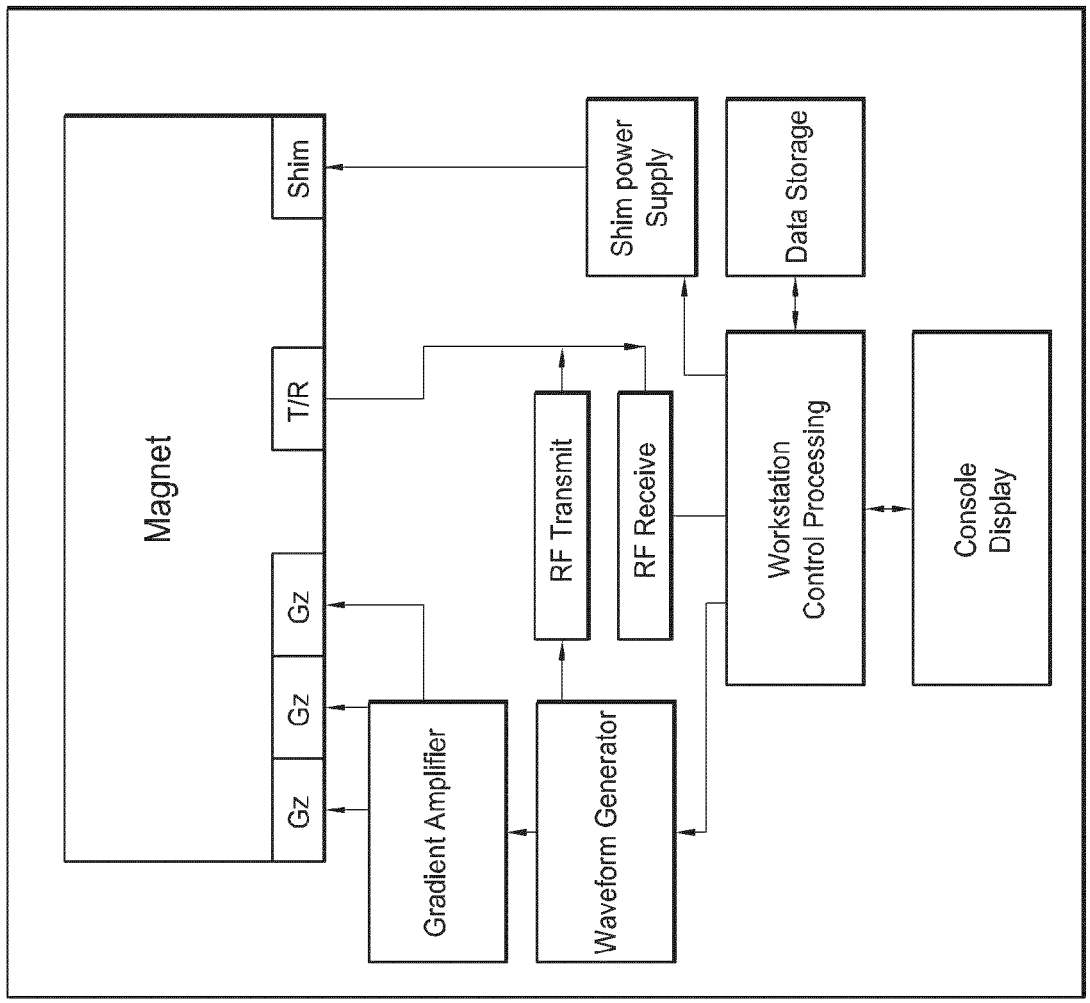
FIG. 1 illustrates a block diagram of an embodiment of an MRI system.

The below disclosure discusses embodiments of a fractal shaped loop RF coil design which can be used for magnetic resonance (MR) imaging. In some embodiments, an assembly of two designed fractal radiofrequency (RF) coils can be used as a phased array coil, and the fractal RF coils can be advantageous over conventional circular shaped RF coils.

Over the past decade many different RF coils for MRI have also been developed. They can be categorized according to their shapes and by the shape of their sensitive region (volume vs. surface), their polarization (linear vs. quadrature), and the number of separate receiver channels (phased array coils). With these advancements, the geometries of RF coils have been formalized as circular, saddle, and birdcage shape. The birdcage coils have become the most popular as a volume coil since they can create a very homogeneous $H_1$ field over an entire volume within the coil. However, in the area of high field MRI (>3.0T), the birdcage coils have not been found as useful due to non-uniformities known as "dielectric resonance" effects, yielding bright and dark areas entire imaging region. Therefore, with the emergence of high field MRI that could provide higher resolution clinical images, the interest in new RF coil geometries, such as a dipole or a patch antenna, commonly used in mobile phones, has increased greatly.

Since Benoit Mandelbrot first defined fractals in 1983, described in Mandelbrot B B, The Fractal Geometry of Nature, *Freeman*. 1983, which is hereby incorporated by reference in its entirety, as a way of classifying structures whose dimensions were not whole numbers, these concepts have been applied to many branches of science and engineering, including fractal electrodynamics for radiation, propagation, and scattering. The fractal concepts have been recently extended to antenna theory and design, and there have been many studies and implementations of different antenna elements and arrays.

Fractal shaped antennas have unique characteristics that can be linked to the geometry properties of fractal. They can be designed for broadband and multiband frequency response that derives from the inherent properties of the fractal geometry of the antenna (See C. Puente, et al., "Fractal multiband antenna based on the Sierpinski gasket," *Electronics Letters*, vol. 32, pp. 1-2, 1996; G. J. Walker and J. R. James, "Fractal volume antennas," *Electronics Letters*, vol. 34, pp. 1536-1537, 1998; and M. Sindou, et al., "Multiband and wideband properties of printed fractal branched antennas," *Electronics Letters*, vol. 35, pp. 181-182, 1999, the disclosure of each of which is hereby incorporated by reference in its entirety).

Disclosed herein are embodiments of fractal RF coils that can be used at high field MRIs while avoiding the non-uniformities commonly found in currently used birdcage coils. For example, the fractal RF coils can be used with 3T, 4T, 5T, 6T, 7T, 8T, 9T, or 10T fields. In some embodiments, the fractal RF coils can be used with greater than 3T, 4T, 5T, 6T, 7T, 8T, 9T, or 10T fields. In some embodiments, the fractal RF coils can be used with less than 3T, 4T, 5T, 6T, 7T, 8T, 9T, or 10T fields. This can provide for higher resolution in clinical images. In some embodiments, a fractal shaped RF coil could be used as an RF coil in MRI. In some embodiments, the fractal RF coils can be used as surface array receive RF coils or high efficiency transmit RF coils to cover various anatomies of the body. In some embodiments, the fractal geometry can be a specific fractal known as a Koch loop. Other fractals can be used as well, such as dragon fractals, Julia Sets, Mandelbrot Sets, Kleinian Group Fractals, Newton Method Fractals, and Sierpinski Triangles. However, other types of fractals can be used as well, and the type of fractal is not limiting. In some embodiments, the fractal RF coil can exhibit a repeating pattern that displays in different scales, though other types of fractals can be used as well. The fractals can have exact self-similarity, quasi self-similarity, statistical self-similarity, qualitative self-similarity, or mutlfractal scaling. Embodiments of a fractal shaped RF coil can have improved properties such as quality (Q) factor and signal to noise (SNR) ratio.

Further, embodiments of the fractal RF coil can offer flexibility in phased array design by minimizing geometrical limitation that can cause mutual interference between RF coils. Accordingly, embodiments of the fractal RF coil could be a useful addition to the design the phased array coils with parallel imaging capability such as SENSE or SMASH, though the type of imaging is not limiting, because neighbor coils can be arranged with minimum overlap or non-overlap without adding components to cancel out mutual coupling, as discussed below (See Pruessmann K P, Weiger M, Scheidegger M B, Boesiger P. *Magn Reson Med* 1999; 42(5):

952-962, and Sodickson D K, Manning W J. Magn Reson Med 1997; 38(4):591-603, the entirety of each of which is hereby incorporated by reference). The disclosure of designing and fabricating embodiments of fractals RF coils may continue to be useful in the future development of larger arrays capable of larger reduction factors in image acquisition. The fractal loop RF coils may also be beneficial to design of high efficiency transmit RF coil arrays by offering alternative geometrical layouts for minimizing coupling.

Magnetic Resonance Imaging

MRIs are a medical imaging technique that use strong magnetic fields and radio waves to form images of a patient, and typically, MRIs are used to acquire diagnostic information on a patient. Embodiments of the disclosed fractal RF coils can be used in such diagnostic techniques. Generally, MRIs form a strong magnetic field around the portion of the patient that is to be imaged. Radio frequency emissions from exited hydrogen atoms can be scanned to create an image. The emissions can be formed using energy from an oscillating magnetic field applied at a resonant frequency. In some embodiments, the MRI can perform an image contrast, which can be weighted to demonstrate different anatomical structures or pathologies.

MRIs use magnetic fields in order to produce images of a patient, and it is advantageous for the magnetic fields to be both strong and uniform. Embodiments of the disclosed fractal RF coils can be used to create the strong and uniforms signals in the MRI.

A block diagram of an embodiment of an MRI scanner is shown in FIG. 1. However, other configurations of MRI scanners can be used, and type and components of the MRI are not limiting. There are several magnetic fields used for different functions in an MRI system. The super-conducting magnet can provide the main magnetic field, used to reorient the nuclei inside the sample that possesses a spin. This magnet coil can be surrounded by a cryogenic (liquid helium and sometimes also liquid nitrogen) tank and a vacuum vessel in order to keep the superconducting temperature. The shim coils can be used to compensate for the BO field inhomogeneity, or heterogeneity. The gradient coils can function to provide a controlled field gradient in each direction, allowing for imaging experiments. RF coils can function both as a receiver to collect the MR signal, and also as a transmitter to generate B I for exciting the sample. The waveform generator and power supplies can be used to generate the gradient waveform and RF pulses in the desired shape and power level. As described in further detail in the disclosure, a fractal RF coil can be used to the same if not better affect than standard coils.

In some embodiments, the MRI system can include other components for operating the MRI scanner, and thus performing magnetic resonance imaging on a patient. In some embodiments, a computer can perform control of hardware systems and data processing, and the operating console (or controller) can be interface to input the imaging parameters and display images. This operating console can be configured to operate the MRI scanner, actuate coils and accept any signals received during MRI scanning, among other various tasks and the tasks of the operating console are not limiting. In some embodiments, both an operating console and a controller are used. In some embodiments, the computer can contain a console display for displaying the images/data received during the MRI scanning process. The display can include both visual and auditory signals. Further, the computer can include memory, or data storage. This can store the MRI data received from the MRI scanner for later use by the MRI system. In some such embodiments, the interface between the controller and the computer can be by means of a direct electrical and/or mechanical connection. In other embodiments, the controller can interface with the computer remotely via wired, wireless, network or other type of connection.

The controller may also be in communication with other devices, including e.g., data processing device(s), storage devices, and/or networks; in some embodiments these additional devices/functionalities may be integral with the controller while in other embodiments, these additional devices/functionalities may be remote and operably coupled to the controller.

The computer and/or controller can further have a processor and/or microprocessor which can be used for programming of the MRI scanner and MRI data. For example, the programming can develop and/or refine an image received from the MRI scanner. However, this is not limiting and the programming can provide other data adjustment parameter. In some embodiments, the computer and/or controller can provide for different programming.

In some embodiments, the computer can be integral with the MRI scanner. In some embodiments, the computer can be a separate device and can be connected to the MRI scanner for receiving data and providing input to the scanner. In some such embodiments, the interface between the controller and the MRI scanner can be by means of a direct electrical and/or mechanical connection. In other embodiments, the controller can interface with the MRI scanner remotely via wired, wireless, network or other type of connection.

Koch Fractals

As mentioned, in some embodiments a specific fractal loop, known as a Koch loop, can be used in an RF coil, can be used with MRIs. The geometry of the Koch loop can be designed and simulated to produce $H_1$ magnetic field in MRI. The Koch loop configuration can have properties the same as, or greater than, circular loops currently used in the field of MRIs. As discussed below, from measurements and MRI experiments, the fractal shaped RF coil with 30 mm radius (short axis) and 52 mm radius (long axis) generated $H_1$ magnetic field as competitive as the circular shaped RF coil with 40 mm radius, though the specific dimensions are not limiting. The isolation properties of the phased array coils comprised of the referred RF coils (fractal shape and circular shape) were measured by the variation of overlap length. The phased array coil made by the pair of fractal shaped RF coils had two optimized overlap positions to eliminate mutual inductance between the adjacent coils, unlike the circular shaped RF coils that had only one location for effective cancellation of mutual inductance. MRI scans were performed with two optimized overlap RF coil assemblies and they produced homogenous images with no distortion in both swallow overlap and deep overlap RF coil assemblies without adding components such as air inductors to be negligible against mutual interference between the neighbor RF coils.

The experimental results of testing embodiments of Koch RF fractals are described in detail below.

Non-Paired Examples

Figure 2A:
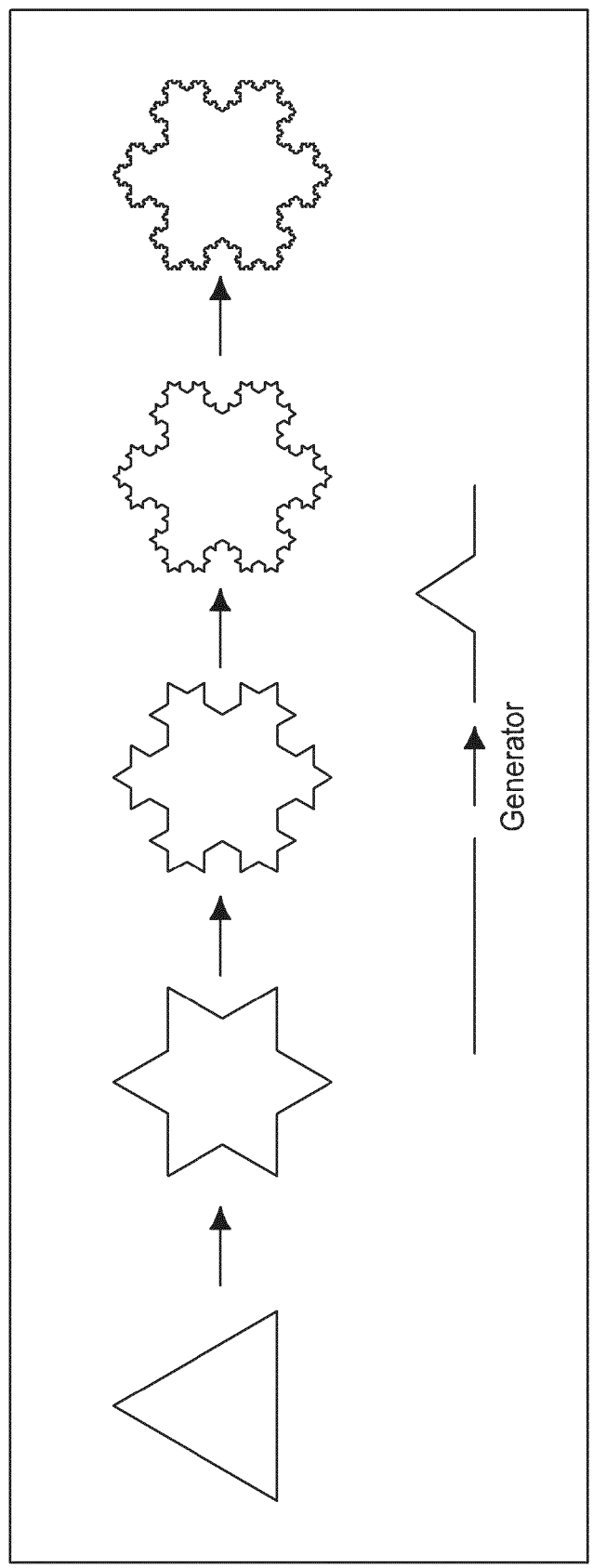
FIG. 2A illustrates an iterative process for making an embodiment of a fractal RF coil.

Fractal geometries are used to represent structures in nature, such as trees, plants, waves, and so on as well as can be described and generated using an iterative process that leads to self-similar and self-affinity structures. Among these various categories, a Koch loop, similar to a snow flake shape, can be used for embodiments of a fractal RF coil. The Koch loops shape can be formed through two generated iterations from a basic triangle shape, referred to as the initiator, as shown in FIG. 2A (See Gianvittorio J P, Rahmat-Samii Y, Fractal Element Antennas: "A Compilation of Configurations with Novel Characteristics," *IEEE Antennas and Propagation Society International Symposium*, Vol. 3, Salt Lake City, Utah, 1688-91 (2000), and Gianvittorio J P, Rahmat-Samii Y, Fractal Element Antennas: "A Novel Antenna Miniaturization Technique, Applications, *IEEE Antennas Propagation Magazine*, 44; 1; 20-36 (2002), the disclosure of each of which is hereby incorporated by reference in its entirety).

The Koch loop fractal geometry was tested in comparison to standard loop RF coils. In the examples tested, the fractal shaped RF coil had 30 mm radius (short axis) and 52 mm radius (long axis), 3.0 mm width and 0.1 mm thickness strip-line. The fractal shaped geometry was designed by using a simulation program SEMCAD X (Ver. 14.2.1 Schmid & Partner Engineering AG, Zurich, Switzerland). However, the specific dimensions of the fractal shaped RF coil are not limiting, and other dimensions can be advantageous.

An $H_1$ magnetic field was computed from the shaped fractal RF coil after tuning it at 3T MRI (127.74 MHz) arranged on a parallel (X-Y plane). Circular shaped RF coils with different radii (30 mm, 35 mm, 40 mm, 45 mm, and 52 mm) were also simulated at 3T resonance frequency, which are compared to the fractal coil by analyzing the strength of $H_1$ magnetic field (A/m).

Figure 2C:
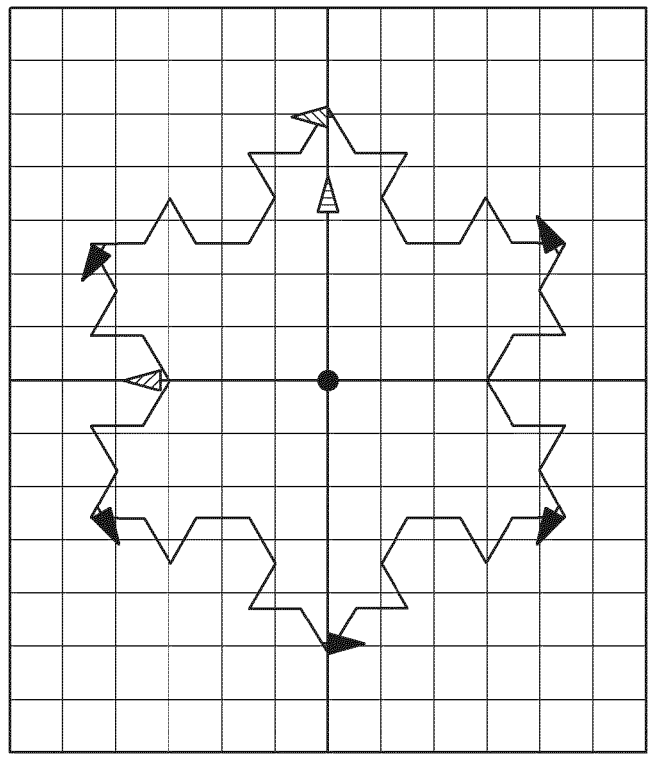
FIGS. 2C-D illustrate simulations for making an embodiment of a fractal RF coil.
Figure 2B:
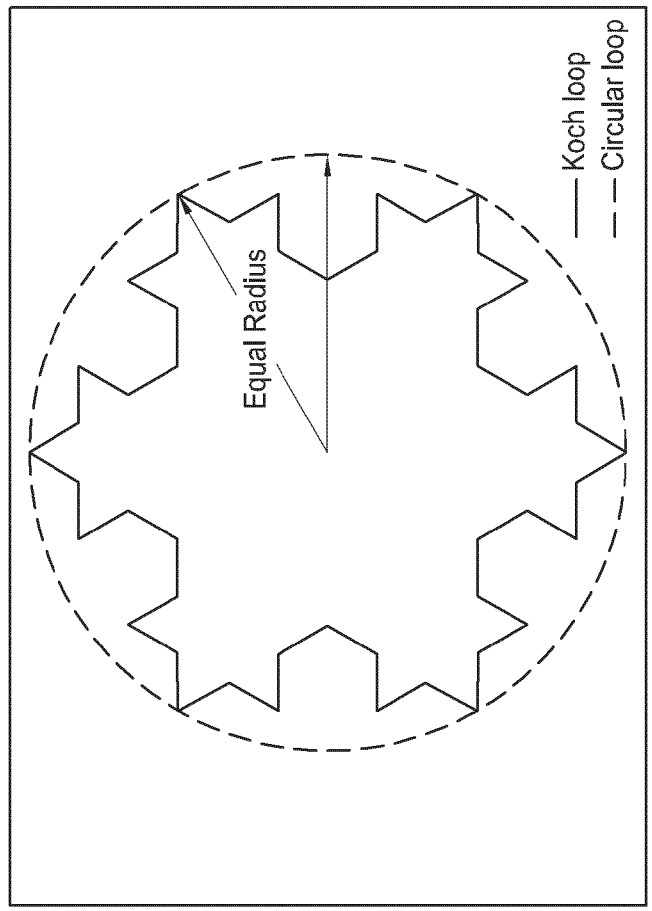
FIG. 2B illustrates an embodiment of a Koch fractal RF loop and a circular loop having the same radius.
Figure 2D:
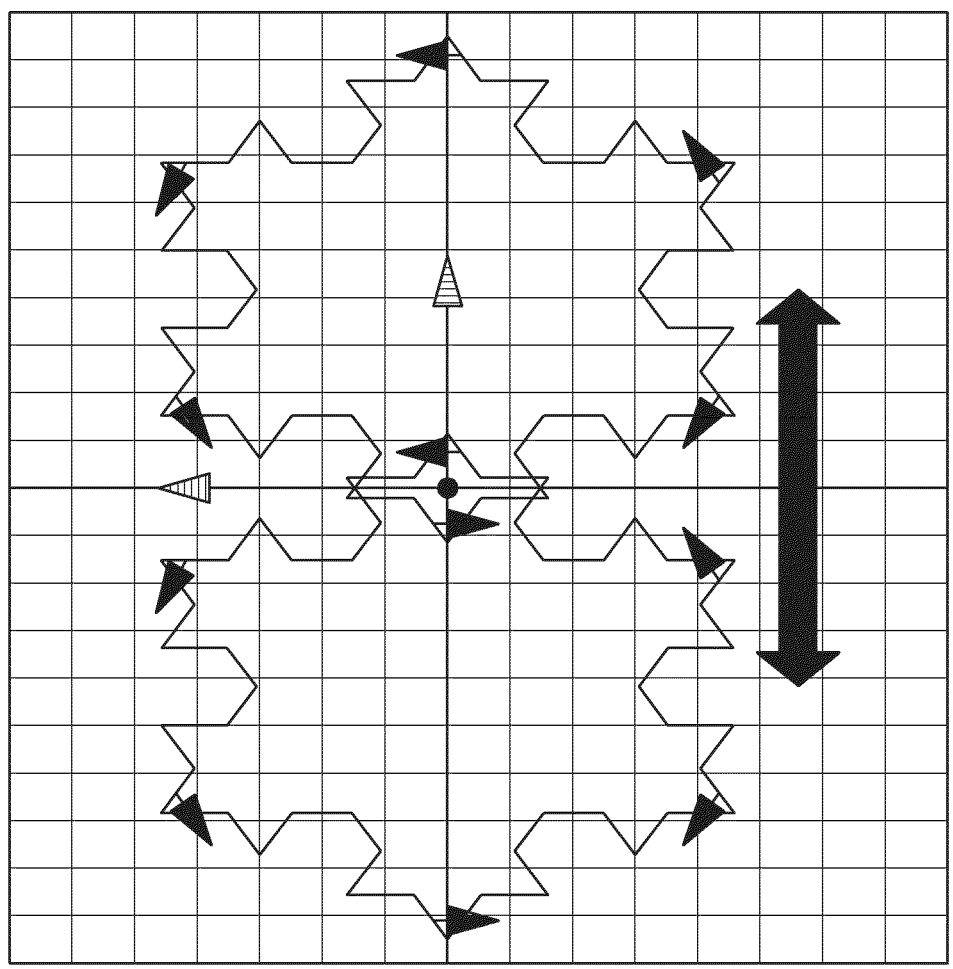

From simulation results, two circular shaped RF coils were also chosen and built with the fractal shaped RF coil. One is the RF coil which generated similar $H_1$ magnetic field profile to the fractal shaped RF coil (radius=40 mm) and the other is the RF coil which had an identical radius 52 mm (long axis) as the fractal shaped RF coil as shown in FIG. 2B. To build the fractal shaped RF coil, a simulation program can be used, as shown in FIGS. 2C-D. The coils could move toward the thick arrow direction to see mutual coupling.

The circuit pattern of the RF coil was etched on FR 4 laminate board that is a flame retardant version of G-10 material. Thickness of the copper strip was 0.0341 mm. The circuit pattern was segmented in direction of four ways symmetrically. Capacitors were soldered between the segmentation of RF coil. It was tuned and matched for 3T MRI. Circular shaped coils patterns were also etched on identical copper pre-sensitized board used for fractal shaped RF coil and they were tuned and matched for 3T as well. This is just one method of forming the RF coils, and other coil construction methods can be used as well. Accordingly, the method of manufacturing the coils is not limiting.

After completing the RF coil construction, Q-factors on unloaded/loaded with a phantom were measured. Further, signal-to-noise (SNR) was estimated from the MR images scanned with the tested RF coils. The SNR from the phantom image was calculated by the equation:

[(signal average−noise average)/(noise standard deviation).

To calculate noise, the standard deviation was measured from the background. From the above-described expirements, fractal shaped RF coil kept the ratio 4.36/1 (176.14/40.43=Phantom unloaded/Phantom loaded) and the circular shaped RF coil with radius=40 mm and radius=52 mm retained the ratios 3.87/1 ($\approx$187.35/48.47) and the ratio 4.11/1 (175.21/42.64), respectively.

For phantom studying, the phantom used was (Philips Medical Systems, Netherland) a bottle (radius: 51 mm and height: 205 mm) that is filled with 2000 cc mineral oil because oil-based phantoms (the static dielectric constants: $\in$=2) instead of water-based ones ($\in$=80) can be to be more suitable for assessing image uniformity at high field MRI.

The output from the RF coil was connected a coil interface box which was developed by Philips Medical Systems. RF coils were receive-only coils and the passive and active combination detuning method was utilized to decouple the RF coil from the RF transmitter while high power RF energy was transmitting. MR images were acquired from 3T Philips Achieva System (Philips Medical Systems, Netherlands) using T1 weighted spin echo technique, with the phantom placed on each coil with 10 mm acrylic plate spacing as shown by FIGS. 3A-B. FIG. 3A shows an experimental setup for a single loop RF coil, and FIG. 3B shows an actual view of an experimental setup. Images obtained using the following acquisition parameters: Sagittal and axial direction, Field of View (FOV)=250 mm×250 mm, Matrix size=512×512, time to echo (TE)=10 ms, time to repetition (TR)=300 ms, Thickness=3 mm, and number of signal averages=1.

FIGS. 4A-C illustrate sagittal images acquired from the experimental setup shown in FIGS. 3A-B with three different RF coils. (a) the fractal shaped RF coil; (b) the circular shaped RF coil (radius=40 mm); and (c) the circular shaped RF coil (radius=52 mm).

Figure 5:
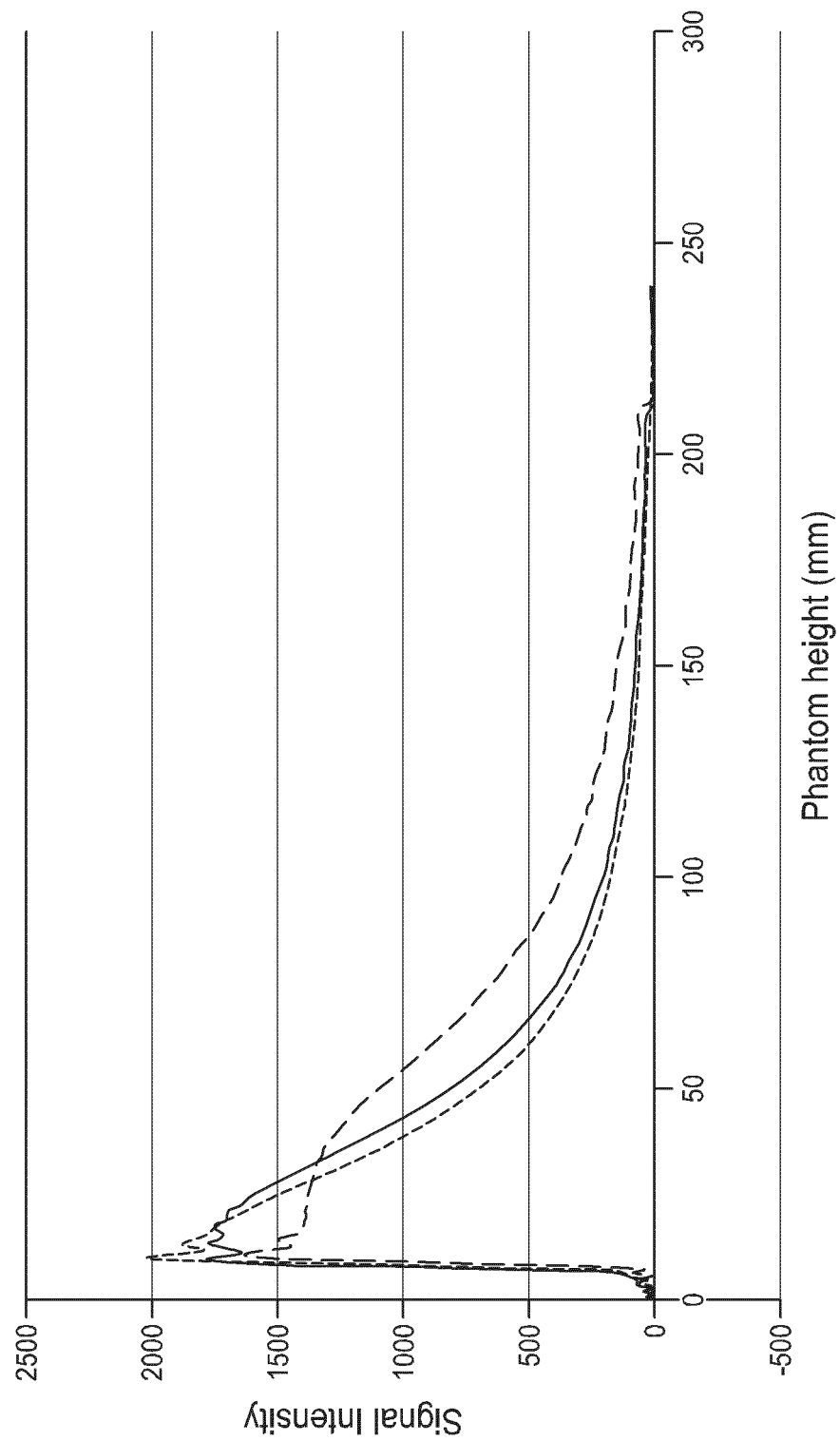
FIG. 5 illustrates image intensity profiles when plotted the centerline of phantom images (FIGS. 4A-C) horizontally, according to some embodiments.

FIG. 5 illustrates image intensity profiles when plotted the centerline of phantom images (FIGS. 4A-C) horizontally, according to some embodiments. The phantom profile of the fractal RF coil, the circular shaped RF coil (40 mm radius), the circular shaped RF coil (52 mm radius) were rendered into the solid line, small line, and thick dash line respectively.

In MRI experiments, the intensity profile of phantom image was generated from the fractal shaped RF coil and compared with the profile of the circular shaped RF coil (radius 40 mm) as it delivered similar intensity profile in the simulation study. However, the signal intensities of both RF coils were inferior to the circular shaped RF coil (radius 52 mm) after about 35 mm on the bottom of phantom, unlike profiles of longitudinal magnetic field distribution in simulation.

Paired Examples for Reduction of Mutual Coupling

Eliminating strong mutual coupling among the adjacent elements in a RF coil array can be advantageous in MRIs as this elimination can increase efficiency of the device. Especially for multi-element array designs, decoupling the densely-packed resonant elements from each other can become progressively difficult. Overlapping RF coil elements is commonly-used as a decoupling technique for loop-type RF coil arrays. However, overlapping the RF coils can have a space restraint in designing multi-element arrays because of mutual coupling among distant neighbor coils as well as decreases parallel imaging performance by degrading the geometric factor in the overlapping area of sensitivity. Therefore, a non-overlapped array design can be used for current parallel imaging techniques to enable faster imaging but it is not readily feasible because of usage of crossover air inductors and shared capacitors. Inductive and capacitive decoupling methods implemented between two adjacent coil elements requires a dedicated circuit connecting adjacent coil, which lead to additional ohmic loss and difficulty in frequency tuning and matching for separate elements. In the disclosure, a fractal loop RF coil is introduced for keeping the lower radiation loss than the corresponding loop RF coil, which may provide more adjustment of the coil positioning. Further, the fractal loop RF coil can avoid the need for crossover air inductors and shared capacitors, or other equipment that may be needed for non-fractal RF coils.

Further, when identical resonance RF coil loops are placed closed to each other, the mutual inductance can cause splitting of the resonance frequency, which can result in a loss of sensitivity at the resonance frequency. Moreover, signal and noise are also transferred from one coil to another via the mutual coupling, which can create more problems than the array coil is intended to solve. A well-known way to reduce the inductive coupling of close coils to zero is their relative positioning. For the three different pairs of RF coils, the technique of overlapping was selected to eliminate the mutual coupling between adjacent coils. (See Roemer P B, Edelstein W A, Hayes C E, Souza S P and Mueller O M 1990 The NMR phased array Magn. Reson. Med. 16 192-225, the entirety of which is hereby incorporated by reference in its entirety).

After acquiring data from three single loop coils as discussed in detail above, a pair of the fractal coils and three pairs of the circular coils were prepared respectively to integrate them as phased arrays that offer the competitive SNR and resolution of a small surface coil over a field of view. For the array coil construction, mutual coupling could be eliminated, it being a major cause of low SNR and low sensitivity of such coils.

From a constructed pair of RF coils, isolation value was measured per millimeter whenever the overlap length was changed. Isolation measurements (S21) between adjacent coils were performed using a Hewlett-Packard 4395A network analyzer. After setting-up the optimum overlap location of RF coils, the phantom with respective combinations of RF coils as shown in FIGS. 6A-D was scanned.

Figure 6A:
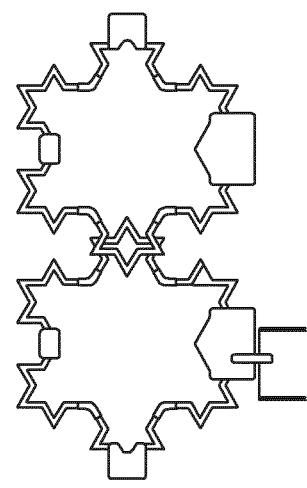
FIGS. 6A-D illustrate designs that were tested as RF coils, including an embodiment of a fractal RF coil (FIG. 6B).
Figure 6B:
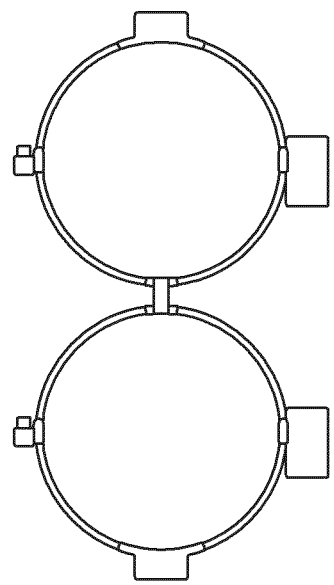
Figure 6C:
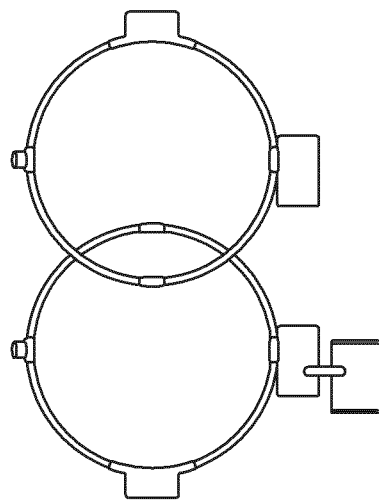
Figure 6D:
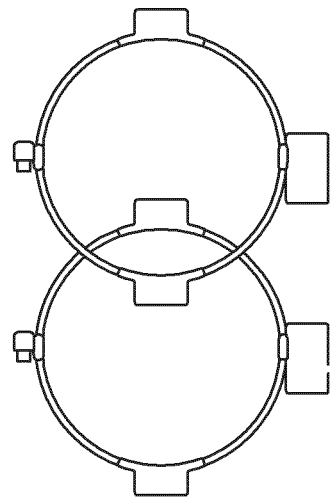

FIG. 6A illustrates a pair of circular loop RF coils (radius=52 mm) with overlap. FIG. 6B illustrates a pair of fractal RF coils with overlap. FIG. 6C illustrates a pair of circular loop RF coils (radius=40 mm) with overlap. FIG. 6D illustrates a pair of circular loop RF coils (radius=40 mm) with non-overlap. This pair of RF coils was placed with a 7 mm gap between neighbors, which used the inductive decoupling method for cancellation of mutual coupling. (See Nabeshima T, Takahashi T, Matsunaga Y, Yamamoto E and Katakura K 1996 RF probe for MRI U.S. Pat. No. 489,847, the disclosure of which is hereby incorporated by reference in its entirety).

Figures 7A, 7B:
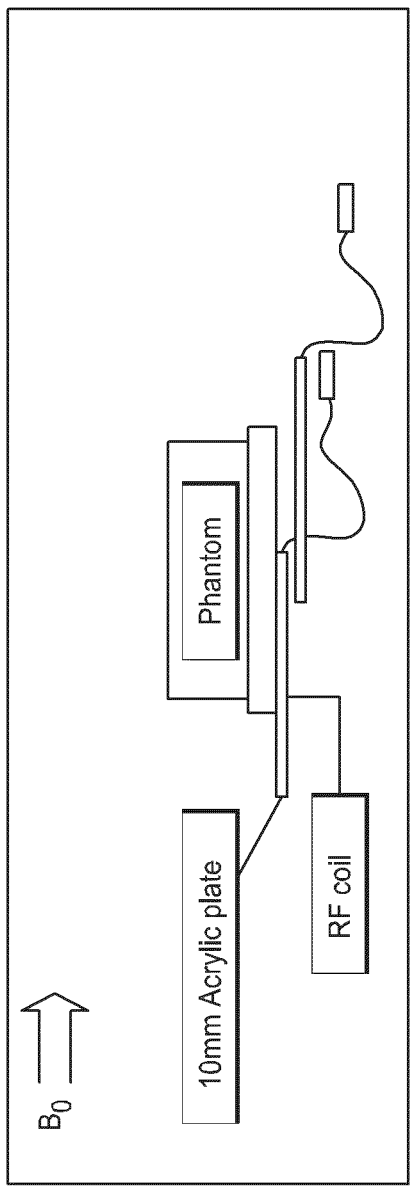
FIGS. 7A-B illustrate embodiments of a setup for testing embodiments of fractal RF coils.

MR images were acquired using the experimental setup shown in FIGS. 7A-B with a pair of RF coils for phantom MR imaging. FIG. 7A illustrates an embodiment of an experimental setup for a pair of RF coils for phantom imaging and FIG. 7B illustrates a prospective view of an actual experimental setup. A brick-shaped phantom (127 mm length, 76 mm width, and 50 mm height) was filled with 2.0±0.05 g/L $CuSO_4$-$5H_2O$, 4.5±0.05 g/L NaCl and 1.89 L distilled water. The phantom was placed on the middle of overlapping RF coils or non-overlapping RF coils. The region of interest is a coronal section 40 mm above the acrylic plate shown by FIG. 7A to avoid image region distorted by the effect of dielectric resonance. The MR pulse sequence parameters were: sequence type=2D T1 weighted spin echo, slice orientation=coronal, repetition time (TR)/echo time (TE)=300 ms/10 ms, matrix=512×512, field of view (FOV)=150×150 mm, slice thickness=2.0 mm, number of excitations (NEX)=2, fold-over direction=FH. The phantom was scanned twice per a pair of RF coils to investigate the SENSE capability of the participating RF coils (See Weiger M, Pruessmann K P, Leussler C, Roschmann P, Boesiger P. *Magn Reson Med* 45:3:495-504 (2001), the disclosure of which is hereby incorporated by reference in its entirety). One was imaged without SENSE and the other with SENSE (g-factor: 2, FH direction).

FIGS. 8A-L illustrate H1 magnetic field generated by embodiments of RF coils that have various radii. Images (FIG. 8A-F) are the magnetic field viewed at the iso-center of the RF coil and images (FIG. 8G-L) are a magnetic field at 40 mm above the iso-center of the RF coil. (FIGS. 8A and G) The fractal coil (radius: 52 mm), the circular shaped coils with the following radii; (FIGS. 8B and H) 52 mm, (FIGS. 8C and I) 45 mm, (FIGS. 8D and J) 40 mm, (FIGS. 8E and K) 35 mm, (FIGS. 8F and L) 30 mm. All of RF coil was resonated to 127.76 MHz. All magnetic fields (dB) computed by separate coils were normalized to 3.17e-010 A/m.

Contrary to the expectations that the fractal coil would produce an $H_1$ magnetic field comparable with the circular shaped coil (FIGS. 8B and H) if both have identical radii (52 mm), the fractal coil produced a narrower magnetic field along a horizontal plane parallel to the plane of the RF coil (FIGS. 8A and G) and higher magnetic field sensitivity in a plane vertical to the iso-center of the RF coil (FIG. 9) from the iso-center to 10 cm away than the circular shaped coil. The longitudinal field distribution of magnetic field and the parallel field propagation of magnetic field produced by the fractal coil (52 mm diameter) were rather similar to the circular shaped coil with radius 40 mm as shown by FIGS. 8D and J and FIG. 9.

Figure 9:
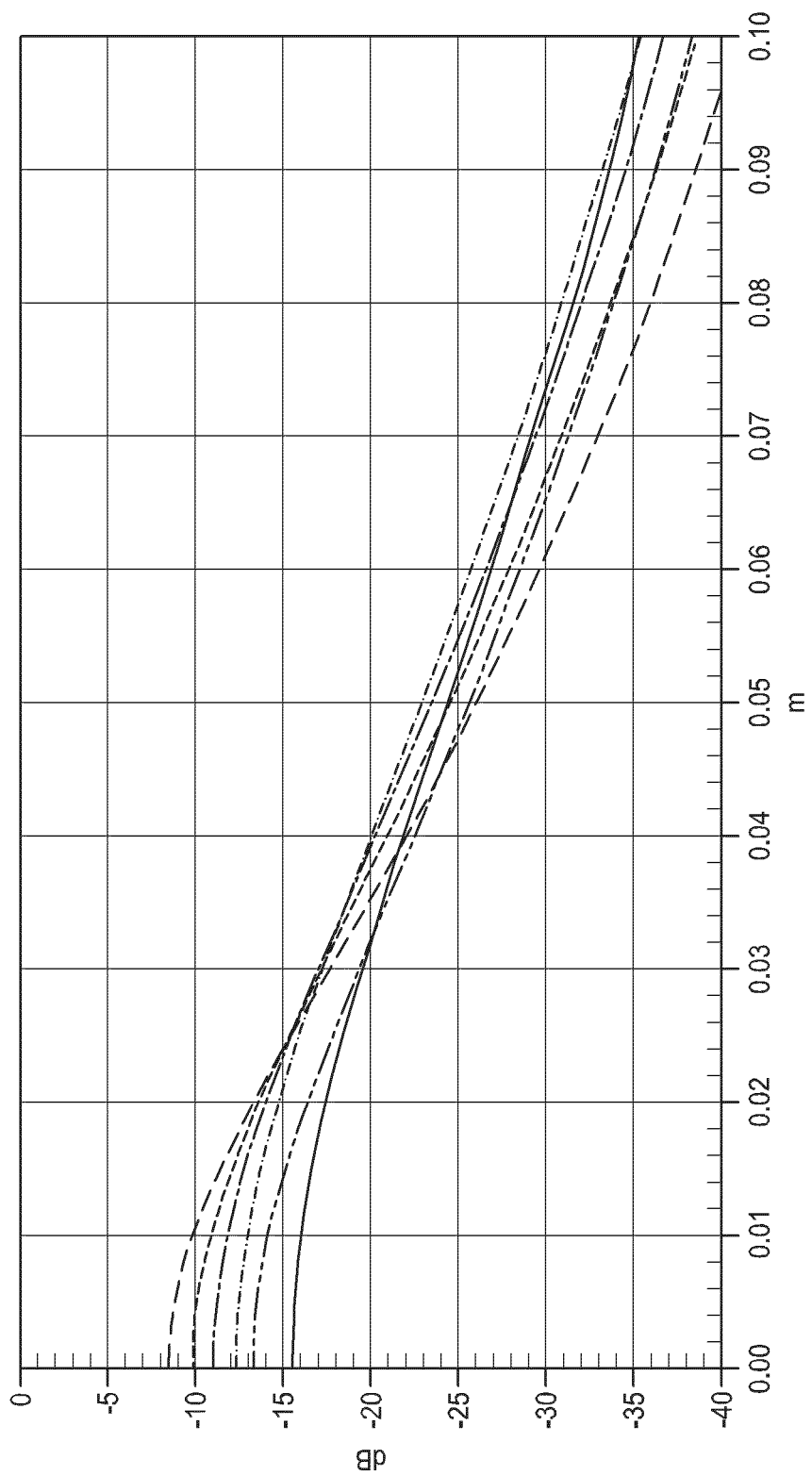
FIG. 9 illustrates profiles of longitudinal magnetic field distribution produced at the iso-center of each RF coil according to some embodiments.

FIG. 9 illustrates profiles of longitudinal magnetic field distribution produced at the iso-center of each RF coil according to some embodiments: Dash-dot line: Fractal Antenna coil, solid line: Circular shaped coil (radius: 52 mm), large dash-2 small dash-large dash line: Circular shaped coil (radius: 45 mm), large dash-small dash line: Circular shaped coil (radius: 40 mm), small dash line: Circular shaped coil (radius: 35 mm), wide dash line: Circular shaped coil (radius: 30 mm). At 40 mm height from iso-center of RF coil, the magnetic field strength of the fractal shaped RF coil was almost equal to the circular shaped coil with a 40 radius. The magnitude of the fractal coil profile was higher than the circular shaped coil with 52 mm radius until 10 cm from the iso-center of RF coil.

Figure 10:
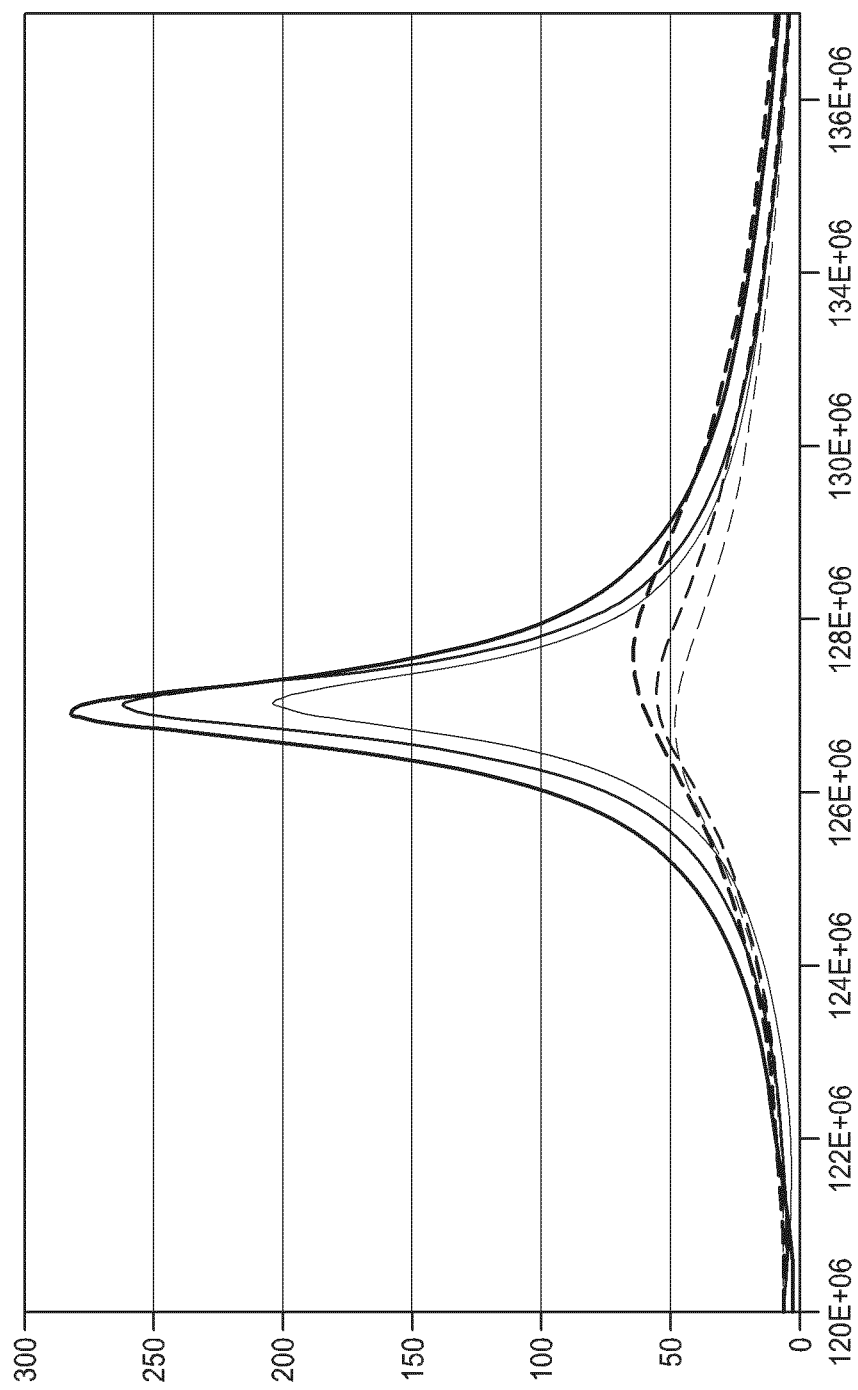
FIG. 10 illustrates impedance variation depending on phantom unloaded/loaded status for certain embodiments of the disclosure.

FIG. 10 illustrates impedance variation depending on phantom unloaded/loaded status for certain embodiments of the disclosure: thick solid line=phantom unloaded status of a fractal shaped RF coil, medium solid line=phantom unloaded status of a circular shaped (radius: 40 mm) RF coil, light solid line=phantom unloaded status of a circular shaped (radius: 52 mm) RF coil, thick dot line=phantom loaded status of a fractal shaped RF coil, medium dot line=phantom loaded status of a circular shaped (radius: 40 mm) RF coil, and thin dot line=phantom loaded status of a circular shaped (radius: 52 mm) RF coil. X-axis=impedance (Ω) and Y-axis=frequency (Hz).

Figure 11:
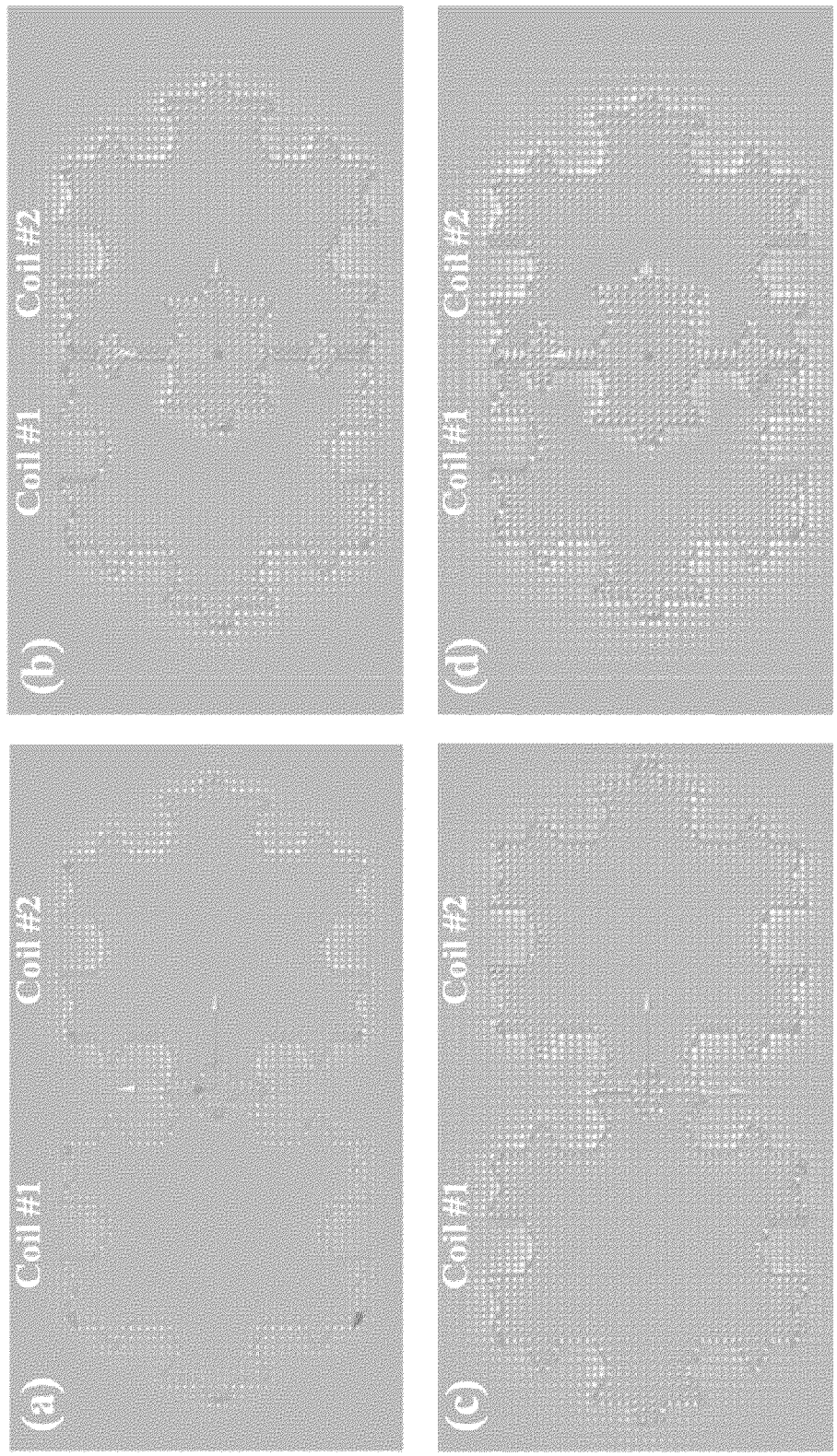
FIGS. 11A-D illustrates a magnetic vector field according to the extent of overlapping between embodiments of a pair of the fractal loop RF coils.

Testing of the fractal loop RF coil was also continued in the simulation study, although the optimum overlap distance value showed discrepancy a bit. FIGS. 11A-D shows the magnetic vector flux for embodiments of a fractal RF coil having different overlap. FIG. 11A shows a small overlapped fractal loop RF coils (15.7 mm overlap: −26.8 dB isolation). FIG. 11B shows a large overlapped fractal loop RF coils (36.7 mm overlap: −27.3 dB isolation). FIG. 11C shows a non-optimized small overlapped fractal loop RF coils (10.7 mm overlap: −10.9 dB isolation). FIG. 11D shows a non-optimized large overlapped fractal loop RF coils (49.7 mm overlap: −7.0 dB isolation).

From the propagation of the magnetic vector flux on the plane of overlap fractal loop RF coils, at embodiments of an optimized positions (FIGS. 11A-B), the magnetic vector flux on overlapped regions between the coils showed much larger than the un-overlapped regions unlike at the non-optimized positions (FIGS. 11C-D), which means the flux density through the overlapped part of one RF coil (Coil #1) is larger and cancels the flux density through the un-overlapped part of the other RF coil (Coil #2). In this case, the EMF induced by the Coil #1 is zero in Coil #2 and it indicates that the mutual inductance between these coils is minimal.

In the phased array configuration, the circular shaped RF coil had only one optimum overlap location, as conventional RF coils usually have, for cancellation of mutual coupling between the immediate neighbors. The circular shaped RF coils had isolation values such as −22.9 dB (radius: 40 mm) and −27.4 dB (radius: 52 mm) between the neighboring RF coils at 15 mm overlap (radius: 40 mm) and 24 mm overlap (radius: 52 mm), respectively.

Figure 12:
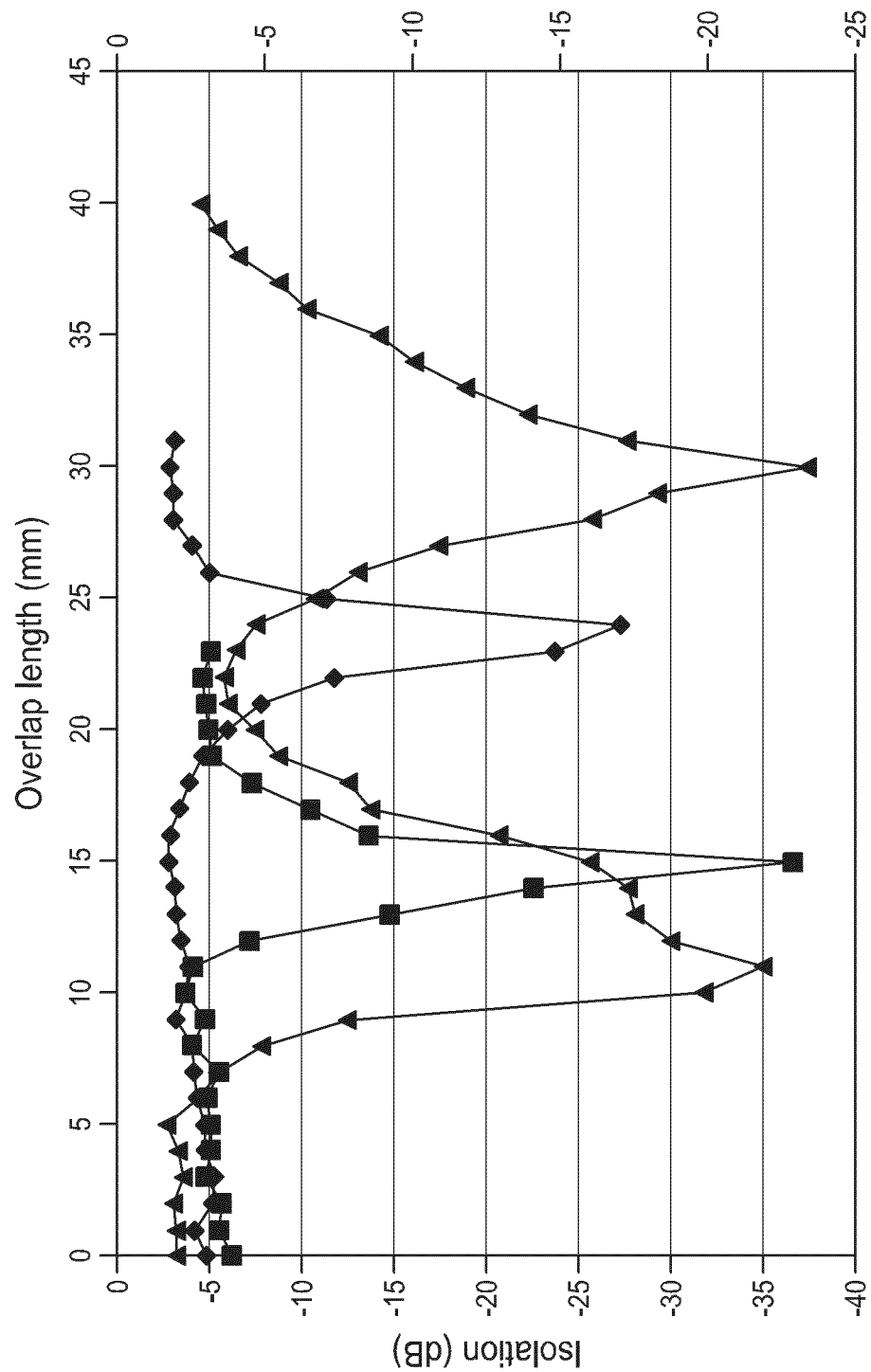
FIG. 12 illustrates isolation variation according to overlap length of a pair of RF coil according to some embodiments.

However, the fractal shaped RF coil had two optimum overlap locations for decoupling mutual inductance, unlike the conventional loop coils. The first optimum overlap location was at 10 mm and the second at 30 mm. The fractal shaped RF coil showed −31.9 dB and −37.5 dB at the 10 mm and 30 mm or 31 mm seperately as shown in FIG. 12. FIG. 12 illustrates isolation variation according to overlap length of a pair of RF coil according to some embodiments: square line=a pair of circular shaped RF coils (radius: 40 mm), diamond line=a pair of circular shaped RF coils (radius: 52 mm), triangle line=a pair of fractal shaped RF coils. In some embodiments, at and 11 mm overlap a −35.1 dB overlap could be found. Even the mutual coupling, being increased when the fractal shaped RF coils were placed close to each other with a 7 mm gap such as the non-overlapped circular shaped RF coil, was reduced to negligible levels by connecting the coils to LNA (input impedance=1.2Ω) without adding air inductors crossover.

Futhermore, the Q-value of an indivisual coil (phantom unloaded: 187.35) in overlapped circular shaped RF coils assembly differed from the one (phantom unloaded: 164.45) in non overlapped RF coils assembly because air inductors for inductive decoupling method were soldered for the non-overlap configuration, which meant the air inductors let the Q-value of RF coil to drop. However, the Q-factor (phatom unloaded=176.14) of the fractal shaped RF coil made no difference between deep overlapped RF coils array and swallow overlapped RF coils.

Based on the isolation results and Q-factor measurements, the fractal RF coils configured two different setups for MR imaging experiments sequentially. The swallow ovelapping set (10 mm RF coil overlap) was compared to the non-overlap circular shaped RF coils set (radius: 40 mm) because the fractal RF coils assembly may have been similar to the non-overlap circular shaped coil spatially. The deep overlapping set (30 mm RF coil overlap) was compared to the overlap circular shaped RF coils sets (radius: 40 mm and 52 mm) as well.

The phantom images, acquired from two different setups for the fractal shaped RF coil array, manifested a trend of non-overlap and overlap RF coil array at without/with parallel imaging. Q-measurements were also reflected in the SNRs of the corresponding MR images. For no parallel imaging, the SNR of the circular shaped RF coil made 17% difference between non-overlap and overlap RF coil assemblies but it made no difference in the case of the fractal shaped RF coils, as listed in Table 1.

TABLE 1

SNR measurements of images scanned from separate RF coils assemblies.
SENSE-2 means that the g-factor is 2 in the FH direction of MRI.
SNRs were estimated from the phantom images selected with identical
height (40 mm above acrylic plate as shown by FIG. 4A).

|  | Fractal RF coil - 10 mm overlap | Circular shaped coil(40 mm) - nonoverlap | Fractal RF coil - 24 mm overlap | Circular shaped coil(40 mm) - overlap | Circular shaped coil(52 mm) - overlap |
|---|---|---|---|---|---|
| SENSE-No | 108.91 | 96.16 | 109.93 | 112.55 | 121.12 |
| SENSE-2 | 87.21 | 75.09 | 82.97 | 85.75 | 79.06 |

Figure 13:
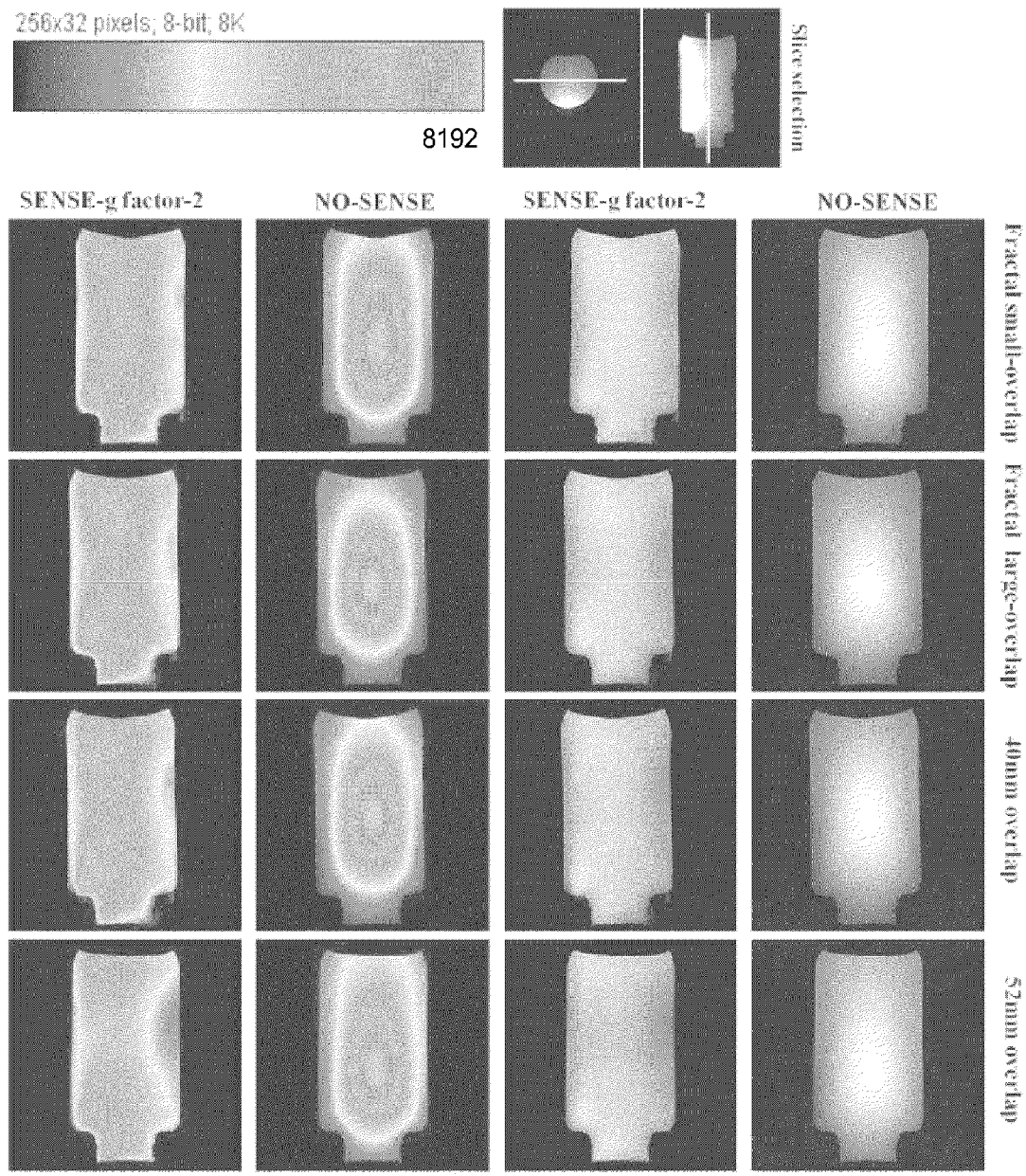
FIG. 13 illustrates coronal MR images of the bottle-shaped phantom.

Further, in MR experiments, the fractal coil pair produced $B_1^-$ phantom images well without inhomogeneity by mutual coupling between adjunct RF coils. As shown in FIG. 13, coronal MR images of a bottle-shaped phantom can be seen. In particular regarding the overlap of coils: 11 mm overlap ($1^{st}$ column), the fractal coil pair with 31 mm overlap ($2^{nd}$ column), the 40-mm loop coil pair with 15 mm overlap ($3^{rd}$ column), and the 52-mm loop coil pair with 24 mm overlap ($4^{th}$ column). The images are a combination of the two individual channels without SENSE ($1^{st}$ and $3^{rd}$ rows) and with SENSE with a g-factor of 2 ($2^{nd}$ and $4^{th}$ rows).

Figure 14:
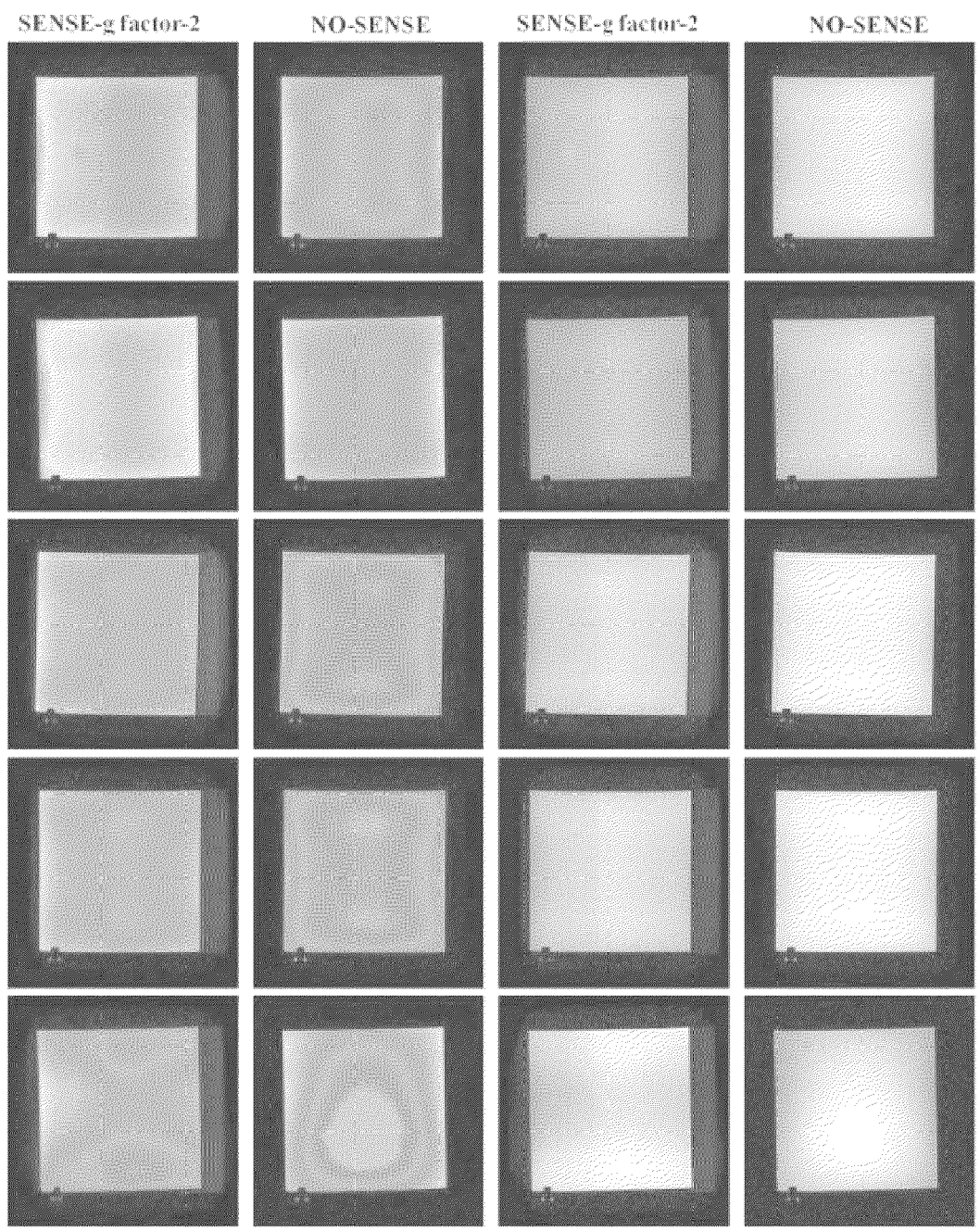
FIG. 14 illustrates Coronal MR magnitude images of the uniform brick shaped phantom with different two channels RF coils assembly according to some embodiments.

FIG. 14 illustrates Coronal MR magnitude images of the uniform brick shaped phantom with different two channels RF coils assembly according to some embodiments; the fractal shaped RF coil with 10 mm overlap (1st column), the circular shaped RF coil (40 mm radius) with non-overlap (2nd column), the fractal RF coil with 24 mm overlap (3rd column), the circular shaped RF coil (40 mm radius) with overlap (4th column), and the circular shaped RF coil (52 mm radius) with overlap (5th column). The images can be combined images from two individual RF channels without/with SENSE technique; With no SENSE (1st low), with SENSE (g-factor: 2) (2nd low), with no SENSE and RGB scale (3rd low), and with SENSE (g-factor: 2) and RGB scale (4th low). All images acquired from individual coils had small difference since they were scanned with separate coils sequentially. However, the phantom was positioned identically from vertical axis in the experimental setup and all images were selected with identical height location (40 mm above RF coil). All images were adjusted to identical contrast level.

From the foregoing description, it will be appreciated that embodiments of an inventive fractal RF coils are disclosed. While several components, techniques and aspects have been described with a certain degree of particularity, it is manifest that many changes can be made in the specific designs, constructions and methodology herein above described without departing from the spirit and scope of this disclosure.

Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as any subcombination or variation of any subcombination.

Moreover, while methods may be depicted in the drawings or described in the specification in a particular order, such methods need not be performed in the particular order shown or in sequential order, and that all methods need not be performed, to achieve desirable results. Other methods that are not depicted or described can be incorporated in the example methods and processes. For example, one or more additional methods can be performed before, after, simultaneously, or between any of the described methods. Further, the methods may be rearranged or reordered in other implementations. Also, the separation of various system components in the implementations described above should not be understood as requiring such separation in all implementations, and it should be understood that the described components and systems can generally be integrated together in a single product or packaged into multiple products. Additionally, other implementations are within the scope of this disclosure.

Conditional language, such as "can," "could," "might," or "may," unless specifically stated otherwise, or otherwise understood within the context as used, is generally intended to convey that certain embodiments include or do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than or equal to 10% of, within less than or equal to 5% of, within less than or equal to 1% of, within less than or equal to 0.1% of, and within less than or equal to 0.01% of the stated amount.

Some embodiments have been described in connection with the accompanying drawings. The figures are drawn to scale, but such scale should not be limiting, since dimensions and proportions other than what are shown are contemplated and are within the scope of the disclosed inventions. Distances, angles, etc. are merely illustrative and do not necessarily bear an exact relationship to actual dimensions and layout of the devices illustrated. Components can be added, removed, and/or rearranged. Further, the disclosure herein of any particular feature, aspect, method, property, characteristic, quality, attribute, element, or the like in connection with various embodiments can be used in all other embodiments set forth herein. Additionally, it will be recognized that any methods described herein may be practiced using any device suitable for performing the recited steps.

While a number of embodiments and variations thereof have been described in detail, other modifications and methods of using the same will be apparent to those of skill in the art. Accordingly, it should be understood that various applications, modifications, materials, and substitutions can be made of equivalents without departing from the unique and inventive disclosure herein or the scope of the claims.

What is claimed is:

1. A magnetic resonance imaging device comprising:
   at least one super-conducting magnet;
   at least one shim coil configured to compensate for magnetic field inhomogeneity;
   at least one gradient coil configured to provide a controlled field gradient in each direction; and
   at least two fractal shaped RF coils configured to detect an MR signal and to generate magnetic fields for exciting a sample, wherein the at least two fractal shaped loop RF coils have two optimum overlap locations for decoupling mutual inductance.

2. The device of claim 1, further comprising:
   a controller comprising programming and memory, the controller configured for inputting parameters to the magnetic resonance imaging device and for detecting and processing the MR signal.

3. The device of claim 1, wherein each of the at least two fractal shaped loop RF coil has a narrower magnetic field along a horizontal plane parallel to the plane of the RF coil as compared to a circular shaped coil.

4. The device of claim 1, wherein each of the at least two fractal shaped loop RF coil has higher magnetic field sensitivity in a plane vertical to the iso-center of the RF coil from the iso-center to 10 cm away than the circular shaped coil.

5. The device of claim 1, wherein the magnetic resonance imaging device is operated at resonant frequencies equal to or greater than about 3T.

6. The device of claim 5, wherein the magnetic resonance imaging device is operated at resonant frequencies of equal to or less than about 7T.

7. The device of claim 1, wherein each of the at least two fractal shaped loop RF coils can comprise a Koch loop.

8. The device of claim 1, wherein an air inductor is not used.

9. A method for imaging a patient comprising:
   aligning magnetization of atomic nuclei in a sample;
   applying a radio frequency magnetic field from two fractal shaped RF coils configured to alter alignment of the magnetization;
   detecting a rotating magnetic field from the sample; and
   constructing an image from the rotating magnetic field;
   wherein the two fractal shaped RF coils are at least partially overlapped, and mutual inductance is generally eliminated.

10. The method of claim 9, wherein the magnetic field is equal to or greater than about 3T.

11. The method of claim 9, wherein the magnetic field is equal to or less than about 7T.

12. A radiofrequency coil assembly for use in a magnetic resonance device comprising:
   a first radiofrequency coil configured to receive a magnetic signal, the first radiofrequency coil having a Koch loop fractal shape; and a second radiofrequency coil configured to receive a magnetic signal, the second radiofrequency coil having a Koch loop fractal shape;

wherein the first and second fractal RF coils are at least partially overlapped; and wherein mutual inductance between the first and second fractal RF coils is generally eliminated.

13. The radiofrequency coil assembly of claim 12, wherein the first and second radiofrequency coils are configured to operate at a magnetic resonance of at least about 3T or greater.

14. The radiofrequency coil assembly of claim 13, wherein the first and second radiofrequency coils are configured to operate at a magnetic resonance of about 7T or less.

* * * * *